United States Patent [19]
Hsieh et al.

[11] Patent Number: 5,774,411
[45] Date of Patent: Jun. 30, 1998

[54] METHODS TO ENHANCE SOI SRAM CELL STABILITY

[75] Inventors: Chang-Ming Hsieh; Louis L. Hsu; Jack A. Mandelman; Mario M. A. Pelella, all of Dutchess County, N.Y.

[73] Assignee: International Business Machines Corporation, Armonk, N.Y.

[21] Appl. No.: 712,537

[22] Filed: Sep. 12, 1996

[51] Int. Cl.[6] .................................................. G11C 8/00
[52] U.S. Cl. ...................... 365/230.06; 365/204; 365/156
[58] Field of Search ...................................... 365/154, 156, 365/204, 230.06, 206, 189.11; 257/347, 349

[56] References Cited

U.S. PATENT DOCUMENTS 5,566,120  10/1996  D'Souza ........................ 365/230.06 X

*Primary Examiner*—Joseph A. Popek
*Attorney, Agent, or Firm*—Whitham, Curtis, Whitham & McGinn; Joseph Abate

[57] ABSTRACT

Modifications of a digital logic device, such as a static or dynamic random access memory (SRAM or DRAM) or pass gate logic circuit or the like, implemented with complementary metal-oxide-semiconductor (CMOS) structures formed with silicon-on-insulator (SOI or, more specifically, SOICMOS) technology effectively suppress transient parasitic bipolar current disturbances (e.g. transient half select write disturb instabilities) caused by a discharge current through a parasitic lateral bipolar transistor formed under the transfer gate field effect transistors. Level shifting of the "off" voltage applied to the gate electrode of the transfer gate transistor dynamically changes the gain of the cell transfer gate to increase memory cell stability without compromising the memory capacity per chip or read/write memory cycle time even though level shifting can greatly increase majority carrier density in the floating body (gate) of a SOICMOS transistor at a particular level shifted voltage range. Alternatively, or additionally, the discharge of deselected cells can be slowed to avoid instability by increasing resistance of the transistors in the data buffer (with saving of chip space) and/or increasing bit line capacitance by increasing bit line length (allowing increased memory array size or an additional cell array on a chip).

20 Claims, 10 Drawing Sheets

METHODS TO ENHANCE SOI SRAM CELL STABILITY

BACKGROUND OF THE INVENTION

1. Field of the Invention

The present invention generally relates to silicon-on-insulator (SOI) digital logic circuits and more particularly, to high capacity static random access memories (SRAMs) formed at high integration density.

2. Description of the Prior Art

Data processors must be supported by memory arrangements for storage of both the instructions which they are to carry out and the data upon which operations are to be performed in accordance with the instructions. Generally several different types of memory devices are used, depending on the need to change data stored therein, speed of access, the amount of data accessed and frequency of access required to support the speed of operation of modern data processors. Generally a mass storage is provided for storage of applications programs and files together with a substantial quantity of random access memory from which much smaller quantities (e.g. groups of bytes) of data and/or instructions can be accessed at extremely high speed and frequency of access. Caching schemes are often implemented to improve apparent access time from the mass storage.

Much of the random access memory (RAM) is commonly provided in so-called dynamic RAM or DRAM since dynamic memory cells have very small element counts and very high integration density and memory capacity per chip can be readily achieved. However, DRAMs do not provide optimal access speed since they must be refreshed periodically to maintain stored signals and are not available during periods the refresh operation is being carried out. Further, since signals are capacitively stored as extremely small amounts of charge which is subject to leakage, sense amplifier operation may be slowed somewhat. Accordingly, so-called static RAM (SRAM) is generally provided for optimally fast access by the processor even though cost of such memory is much greater and many fewer memory cells can be provided on a single chip because a plurality of transistors are required for each memory cell.

Recent SRAM designs have often exploited silicon-on-insulator (SOI) technology which provides significant advantages when the memory cell circuits are formed using CMOS field effect transistors. This technology is characterized by the formation of a thin silicon layer for formation of the active devices over an insulating layer, such as an oxide, which is, in turn, formed over a substrate. Transistor sources and drains are formed by, for example, implantations into the silicon layer while transistor gates are formed by forming a patterned oxide and conductor (e.g. metal) layered structure. Such structures provide a significant gain in performance by having lower parasitic capacitance (due to the insulator layer) and increased drain current due to floating body charging effects (since no connection is made to the channel and charging of the floating body provides excess storage of majority carriers which dynamically lower the threshold voltage, resulting in increased drain current). However, the floating body can introduce dynamic instabilities in the operation of such a transistor.

Specifically, an SOI field effect transistor comprises two separated impurity regions, generally formed by implantation, constituting the source and drain of the transistor with the channel region between them covered by a thin gate insulator and a conductive gate. No electrical connection is made to the channel region and therefore the channel region between the source and drain is electrically floating because the source and drain regions normally extend entirely through the thin silicon layer. The boundaries between the channel region and the source and drain, respectively, form junctions which are ordinarily reverse biased. Conduction in the channel region occurs immediately below the gate insulator in a region in which depletion is controlled by the gate voltage. However, the junctions at the boundary of the source and drain also form a parasitic lateral bipolar transistor which, in effect, exists somewhat below the field effect transistor. However, under some bias conditions, the parasitic bipolar device may transiently dominate the operation of the field effect transistor and effectively occupy substantially the entire silicon layer.

Specifically, when such a transistor is used in a SRAM cell, each of the source, gate and drain is generally held at one of two voltage levels corresponding to one of two logic states. However, when the source and drain are both at a high logic level (e.g. 2.5 volts) the channel region will also become charged to that voltage. If the drain (or source) electrode of the transistor is then quickly changed to a low logic level (e.g. 0.0 volts) the junction between the drain or source and the channel region will become forward biased and electrons are injected from the drain or source (e.g. the bit line diffusion, which is thus effectively the emitter of the parasitic lateral bipolar transistor) into the channel (which forms the base of the parasitic bipolar transistor). This base-emitter current, in turn, causes conduction of the parasitic transistor and develops a large current spike, even when the gate is held at a low logic level which is otherwise sufficient to turn off the field effect transistor.

It should be understood that such parasitic bipolar conduction can occur at any time the source and drain of an SOI FET are raised high and then one of the source and drain brought low. This phenomenon will be discussed in the context of a SRAM operated in a precharged mode since the condition is always present during write operations. However, it should also be understood that parasitic bipolar conduction can occur in dynamic random access memories (DRAMs) and often with more severe results since there is no mechanism for replacement of charge lost in the discharge current other than periodic refresh which may be incorrectly carried out if the discharge is sufficiently great. Similarly, parasitic bipolar conduction can occur in other types of circuits employing SOI FETs such as pass gate logic circuits causing erroneous function.

In essence, the conduction effect is such that the parasitic bipolar transistor will conduct for a brief period even though the field effect transistor is theoretically "off" simulating the effect of the field effect transistor being briefly turned on but developing higher currents during the brief current spike. Thus, the write operation will be conducted correctly for the selected cell where the field effect transistor is "on". However, every deselected memory cell (where the field effect transistor is theoretically "off") connected to the same bit line pair and which is of the opposite state to the data being written is placed in jeopardy of having its logic state reversed by the write operation.

In a SRAM cell, regardless of the details thereof, it is customary to perform selection and deselection with a pair of transistors in each memory cell connected, respectively, as transmission gates between storage nodes of the cell and a complementary pair of bit lines which carry data being written or read and which have their gates connected to a word line which thus controls connection of the memory cell to the bit lines. In modern SRAM designs, it is also customary to precharge the bit lines to a high logic level prior to a read or write operation to allow faster response of the memory device. Thus, regardless of the logic state of any particular memory cell, one of the transistors of the pair of transmission gate (or transfer gate) transistors in every cell of the memory will have both source and drain driven to a high logic level which will cause charging of the floating body (gate). When the logic state of the cell is to be changed, that same transistor will have the logic level at the drain (or source) change rapidly from a high to low logic level. This operation is thus identical to the conditions described above which cause conduction in the parasitic bipolar transistor. However, during read operations, a data "0" on the selected memory cell allows the corresponding precharged bit line to partially discharge while a data "1" holds the opposite precharged bit line high until the differential voltage can be sensed by sense amplifiers. For this reason, no cell disturbance due to parasitic bipolar conduction is expected during a read operation.

On the other hand, during a write operation, one of the precharged bit lines is driven low (e.g. to the logic low voltage or "rail low", such as 0.0 volts or ground) and the transition occurs much more rapidly (e.g. the transient conditions are confined to a much shorter period, causing much higher current levels), resulting in the instability described above.

When the memory cell has been selected, the field effect transistor of the transmission gate will be conductive and the cell is written to in the normal fashion. However, even when the transistor is deselected and the channel of the field effect transistor is non-conductive in the proximity of the gate, the parasitic lateral bipolar transistor deeper within the silicon layer may conduct (depending on the amount of charge stored on the floating body) sufficiently to cause a change of state of a corresponding deselected memory cell. Since the transistor is deselected but the bit lines are driven, this effect or instability is referred to as a "half-select write disturb".

While the amount of charge on the floating body is small (estimated to be about 25 fC for a 70 Angstrom thick gate oxide at 2.5 volts on a 0.5×10.0 $\mu$m gate) and varies with the length of time the source and drain are held high and the field due to gate voltage, as will be discussed below, the $dQ_b/dt$ current together with a displacement capacitor current, $C(dv/dt)$, confined to the duration of the bit line transient causes a drain current spike which may reach a magnitude of several milliamps for a bit line discharge rate of 1.0 volts/80 psec or faster. This effect is somewhat more pronounced near the bit line drivers but transient voltages in the bit lines may also cause change of state of other memory cells and which may be affected by the location of a selected cell in a substantially unpredictable fashion. Further, this effect is expected to become more pronounced with increased stored charge as the gate oxide is made thinner in more aggressive SRAM designs.

It has been the common practice in SRAM designs to increase cell stability by increase of the beta ratio of the driver transistors in the memory cell to the transfer gate transistors. The beta ratio is defined as the ratio of the respective channel widths divided by the respective channel lengths (e.g. $W_D/L_D:W_{TG}/L_{TG}$) and is a measure of the relative conductivity of the two transistors. That is, when the driver transistor is more conductive, current through the transmission gate transistor has relatively less effect on the memory cell circuit due to the voltage divider action of these two transistors. Beta ratios of about 1.5 to 2.0 are commonly used in current SRAM designs but are insufficient to prevent or suppress the above-described instability due to SOI floating body effect in adequate degree.

Increase of beta ratio above 2.0 to suppress half select write disturb is impractical since increase of width of the driver transistor channel would consume a prohibitive amount of space in current or future SRAM designs at high integration density and high numbers of memory cells per chip, in which case any size increase would be multiplied many (potentially several million) times. Channel length of the driver transistors cannot be significantly reduced without introducing other undesirable effects (e.g. so-called short channel effect, punch-through and the like).

Further, decreasing conductivity of the transfer gate transistor is impractical to increase beta ratio since lower conductivity increases cell access time and may compromise the voltage swing at the memory cell to achieve a change of state thereof. In other words, at beta ratios significantly above 2.0, the memory cell would become so stable that both speed and reliability of writing operations would be compromised. In summary, the design of an SRAM cell circuit does not allow for avoidance of half select write disturb effects since the current in the parasitic lateral bipolar transistor, when it occurs, is comparable to the current through a selected field effect transistor in normal operation in accordance with the design.

SUMMARY OF THE INVENTION

It is therefore an object of the present invention to provide a design and operational method for a digital logic circuit such as a SRAM, DRAM or pass gate logic which suppresses half-select write disturb instability or other erroneous operation due to parasitic bipolar conduction.

It is another object of the invention to provide for increase of memory cell stability while allowing increase of memory capacity and/or decreasing required chip space.

In order to accomplish these and other objects of the invention, a silicon-on-insulator static random access memory device is provided including an array of bistable circuits, transfer gates connected to word lines, bit lines and each of the memory cells, and an arrangement for limiting peak discharge current from a storage node of respective ones of the bistable circuits through a respective transfer gate such as by negative gate voltage applied to the transfer gate or soft bit line discharge.

In accordance with another aspect of the invention, a method of suppressing half select write disturb effects in a silicon-on-insulator static random access memory is provided including the steps of precharging bit lines connected to memory cells, and limiting peak current from a deselected memory cell during discharge of one of said bit lines.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
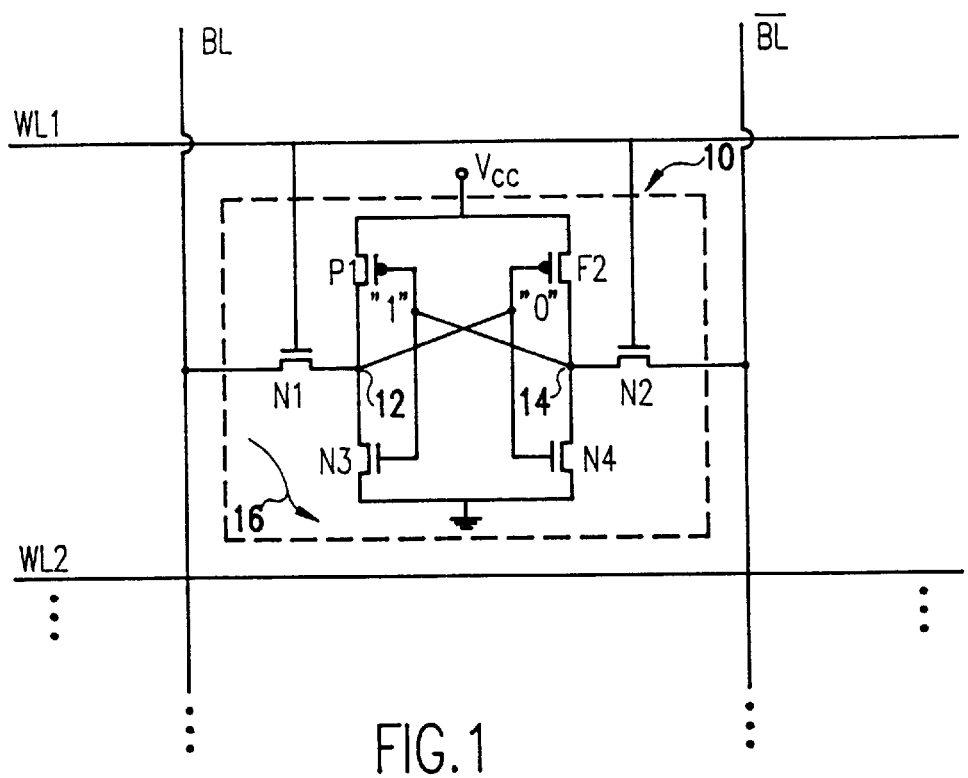
FIG. 1 is a schematic diagram of an exemplary memory cell to which the invention may be applied.

Referring now to the drawings, and more particularly to FIG. 1, there is shown a schematic diagram of a so-called six transistor (6T) memory cell with which the invention may be advantageously employed. It should be noted that while the memory cell circuit is known, no admission is made that any portion of FIG. 1 is prior art as to the present invention. Furthermore, details and circuit design of the memory cell circuit are not important to the practice of the invention and, moreover, at the level of detail shown in FIG. 1, the schematic illustration of the memory cell circuit could be representative of a 6T memory cell either with or without inclusion of the invention. It is also to be understood that the invention is applicable to other digital logic circuits or devices fabricated using SOI FETs such as DRAMs and pass gate logic circuits. In this regard, SRAMs will include a bistable circuit which is controlled by transfer gates; pass gate logic will generally include a pair of load transistors (which may be similarly cross-coupled); and DRAMs will include a capacitive memory element. Since, in each case the bistable circuit, load transistors or memory capacitor will be controlled by similarly connected transfer gate (for SRAMs and DRAMs) or pass gate (for pass gate logic) transistors, the term "controlled element" will be used herein as inclusive of components or circuits corresponding to such elements.

Specifically, a 6T memory cell such as is illustrated in FIG. 1 includes a pair of inverters each comprising a serially connected pair of field effect transistors (P1, N3 and P2, N4) of opposite conductivity types (e.g. CMOS or, more specifically, SOICMOS) and having a common gate connection. The common gate connections of respective transistor pairs are cross-coupled with the nodes connecting the series transistors of each pair of transistors, an arbitrary one of which is referred to as the storage node. Thus, nodes 12 and 14 will always assume voltages representing opposite logic states.

Selection of the memory cell for read or write operations is performed by placing a high logic level voltage on the word line WL1 corresponding to the memory cell in order to render transistors N1 and N2 simultaneously conductive. For read operations, bit lines BL and $\overline{BL}$ are both precharged high and one of the bit lines is discharged in dependence on the stored logic value, as illustrated by arrow 16 for the logic state indicated. For write operations, complementary signals are placed on bit lines BL and $\overline{BL}$ after precharging of the bit lines and connection of the memory cell thereto by transfer gate transistors N1 and N2 in response to a high logic level on word line WL1 will pull down one of nodes 12 and 14 while applying a high logic level to the other in order to change the logic state of the cell, if necessary.

It should be noted that while the period of precharging can be very brief (e.g. 0.1 nsec.), the transfer gate transistor can remain in a state with both source and drain held high for a longer period, referred to as latency. That is, latency is the sum of the precharge period and the time the bit line (or transistor) remains in a state with both source and drain held high and which may continue beyond the completion of the current or even subsequent memory operations until an opposite logic state is written or read. Even when confined to a single memory operation in a short cycle time or a time comparable to the precharge period, the latency period can be long enough for sufficient charge to collect in the floating body/channel region of either N1 or N2 to cause half select write disturb to occur if a high logic level is present on node 12 or 14, respectively, as will always be the case. As a practical matter of the preferred mode of operation of SRAMs, however, for any given memory cell, bit lines BL and $\overline{BL}$ may both be held high for extended periods of time (e.g. often hundreds of milliseconds but theoretically unlimited duration) while the associated word line WL1 is held low, increasing the likelihood to a virtual certainty that sufficient charge will accumulate on the floating body for half select write disturb to occur.

Figure 2:
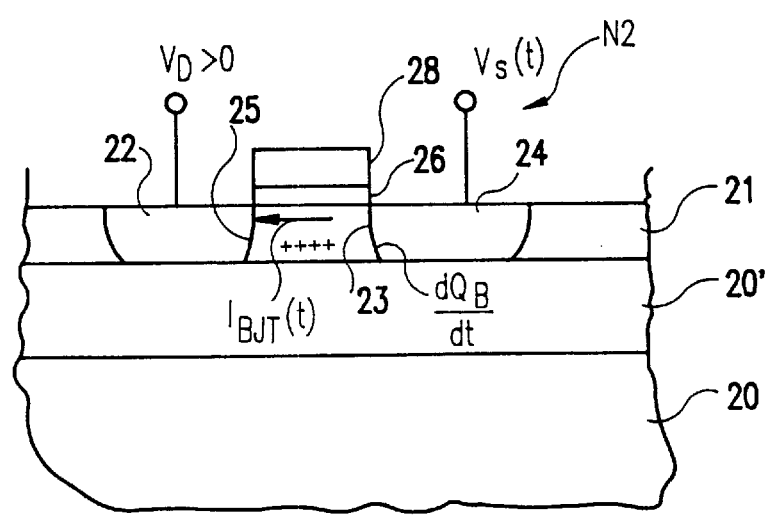
FIG. 2 is a cross-sectional view of a field effect transistor implemented in SOI technology useful in understanding the invention.

Specifically and with reference to FIG. 2, illustrating SOI FET N2 (assumed to be n-type for purposes of this discussion and consistency with FIG. 1), when a high logic level voltage is applied to both drain (node diffusion) region 22 and source (bit line diffusion) region 24 (both of which normally extend through silicon layer 21 to reach insulator 20' on substrate 20) the floating body or channel region under gate oxide 26 will accumulate thermally generated carriers (in this case, holes, indicated by "+"). If the bit line/source is then pulled to a low logic state, junction 23 will be forward biased and electrons will be injected into the floating body to discharge the carriers, as indicated by arrow $dQ_B/dt$. This effective base current in the parasitic lateral bipolar transistor including junctions 23 and 25 causes a current spike $I_{BJT}(t)$ through the parasitic transistor which will tend to discharge the storage node through the node (source) diffusion and may cause reversal of the storage state of the memory cell.

Figure 3:
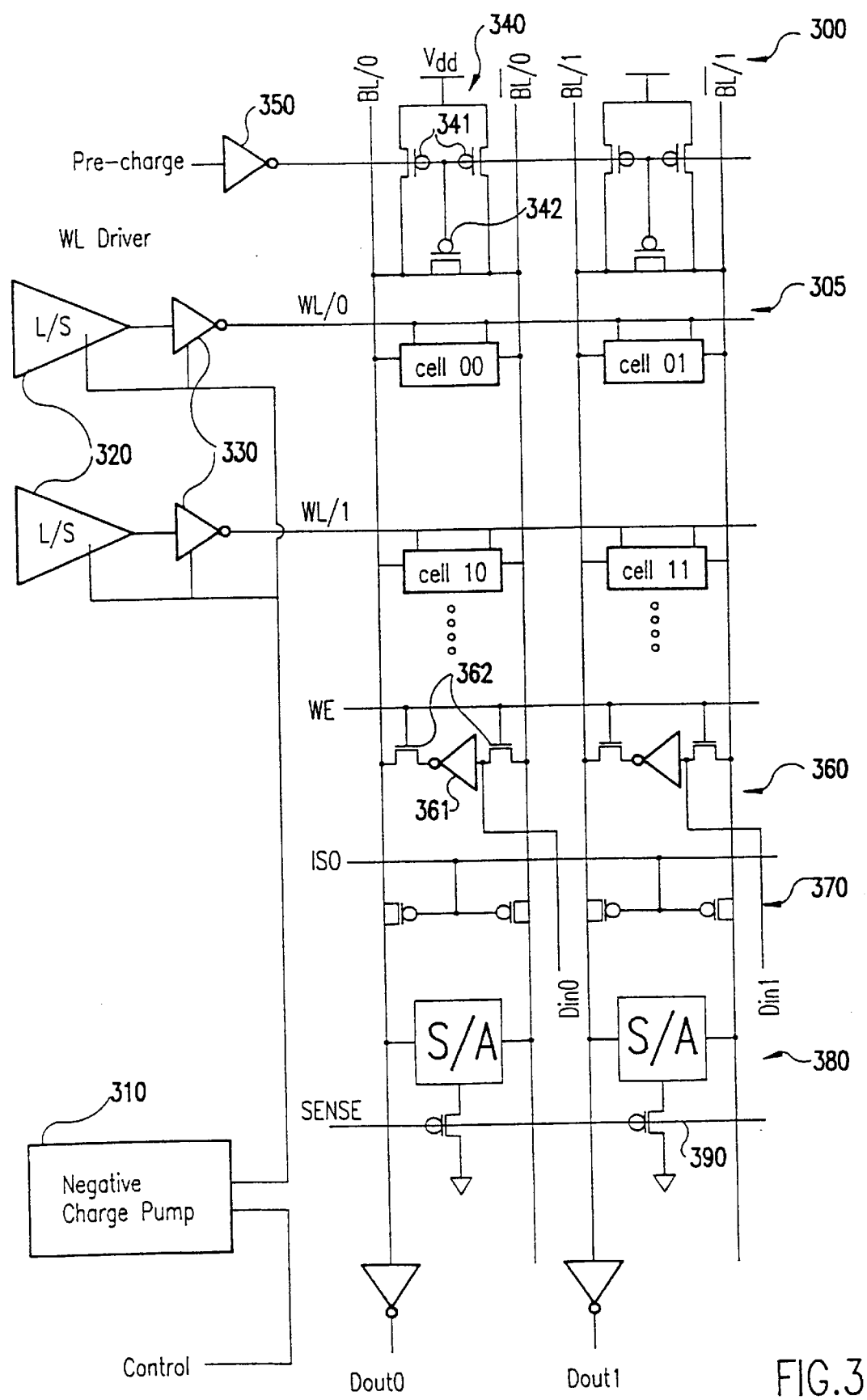
FIG. 3 is a schematic diagram of a memory array circuit including features of the invention.

Referring now to FIG. 3, a schematic of a memory array and driver circuit in accordance with the invention is shown. The memory array is reduced to a matrix of four memory cells (at addresses 00,01,10 and 11) in the interest of clarity since such a small array is sufficient to an understanding of the invention. It should also be understood that the illustration of FIG. 3 at the level of detail shown differs from known arrays principally in the provision of a negative charge pump 310 and level shifters 320 together with inverters or drivers 330. However, it should be understood that portions of the memory array schematically illustrated in FIG. 3 while possibly appearing conventional can also represent hardware modifications of a conventional memory array in accordance with various aspects of the invention.

It will be appreciated that the cells are each connected to a complementary pair of bit lines BL/0, $\overline{BL}$/0 and BL/1, $\overline{BL}$/1 and to a word line WL/0 or WL/1 in a manner similar to the transfer gate connections illustrated in more detail in FIG. 1. In dynamic or precharged SRAM array circuits, precharge circuits 340 are used to bring both bit lines to the same high logic voltage level. Transistors 341 serve to connect the bit lines to the supply voltage $V_{dd}$. Transistor 342 simultaneously connects the bit lines together to balance the voltage between the bit lines at the same voltage since transistors 341 have finite resistances which may not be equal. Since many precharge transistors will be turned on simultaneously and collectively present a substantial gate capacitance, it is advantageous to provide a precharge driver 350. Typically, similar arrangements will be made to precharge other functional elements in the memory array circuit such as the sense amplifiers, write drivers and the like but are omitted in the interest of clarity since such arrangements, whether or not provided, are unimportant to the practice of the invention.

Bit lines are used for both input and output (write and read, respectively). As alluded to above, sense amplifiers 380, when enabled by a low voltage on sense amplifier enable (sae) line 390, sense a difference in voltage as one of the precharged bit lines is discharged through a selected memory cell, depending on the logic state representing stored data in the cell. Since this action is not necessary during a write operation and the sense amplifier inputs represent a significant load, the sense amplifiers may be disconnected, during operations other than read operations, from the bit lines at isolation transistors 370 in response to a high level on the isolation line ISO.

During write operations (with the sense amplifiers disconnected) true and complement data is placed on the bit lines by write drivers 360. These write driver circuits are each basically comprised of an inverter circuit to develop a complement signal and a pair of transfer gate transistors 362 to connect and disconnect the input signals from the bit lines in accordance with a write enable signal WE in a manner similar to the connection of selected memory cells thereto. This provision permits adequate current to drive the capacitance of the bit lines and prevents signals or noise appearing on the data input lines or at the driver outputs from causing unbalancing of the bit lines or high current therein. It is also often the practice to provide early application of input data so that the signal levels can stabilize before being connected to the bit lines particularly since there will be some finite propagation delay in inverter 361.

It will be recalled from the above discussion that the precharge time is intended to be very short, generally about 0.1 nsec., which may, nevertheless, be sufficient for the floating bodies forming the gates of the transfer gate transistors to acquire sufficient charge to cause a significant incidence of half-select write disturbance which is of sufficient severity to change the storage state of at least one memory cell. (While the excess charge acquired by the floating bodies is thermally generated and usually requires times on the order of several tens of milliseconds to fully develop, some charging of the floating bodies will begin whenever both source and drain are high and charging rate can be significantly influenced by other factors such as gate potential. That is, some current spike will occur when the source or drain again goes low, even though the current spike may be very small if the latency is very short. Whether or not stored data will be disturbed by a discharge current spike depends on many factors including stability of the circuit as determined by the beta ratio discussed above but becomes increasingly probable with increase of the magnitude of the current spike. Nevertheless, even for extremely short latency, there is a finite statistical probability that an instance of half-select write disturb will occur.) The following will describe two ways of avoiding the high peak current characteristic of this instability without incurring penalties of operational speed or chip space requirements in accordance with the invention. Further, it will be seen that some operating margins are incidentally improved and that further advantages accrue allowing memories of higher storage capacity to be formed.

Lowered Non-Selected Word Line Voltage

Figure 4A:
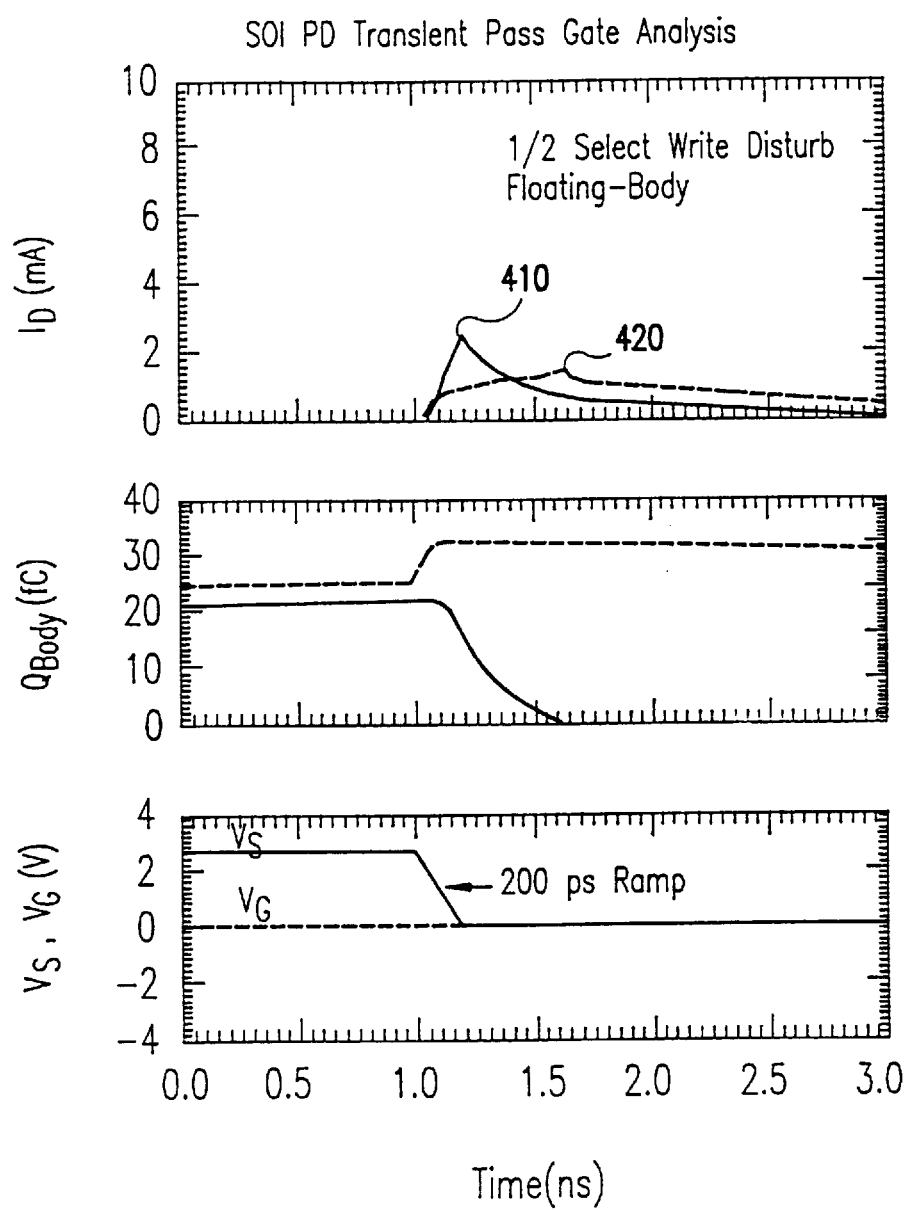
FIGS. 4A, 4B, 4C, and 4D are graphs showing transient pass gate analyses of a SOI FET for different gate voltages.

The inventors have found that if the low logic voltage level applied to the gates to achieve the "off" state is reduced to an even lower voltage, such as a negative level, the conductivity and/or gain of the parasitic bipolar transistor can be reduced. Referring to FIG. 4A, the current spike 410 due to transient conduction in the parasitic bipolar transistor is seen in the top graph of the three graphs (all of FIGS. 4A–4D similarly depict corresponding changes in voltage current and charge and are based on simulations assuming a 0.1 nsec. precharge and a 200 psec. bit line fall time, depicted by a solid line $V_s$ in the middle graph of each Figure). In this case, the voltage applied to the gate $V_g$ is zero as shown in the bottom graph of FIG. 4A.

The middle graph in FIG. 4A shows, with a dashed line, the effective base-source bias voltage, $V_{bs}$, and, with a solid line, the change in charge due to the population of majority carriers (in this nMOS case, holes) as a result of the discharge current. The peak current level 410 can be reduced and the peak delayed if the bit line fall time is longer, such as 800 nsec., as shown at 420. However, the amount of charge transferred as parasitic bipolar transistor current is not significantly changed. While such charge loss can be resupplied within the operational margins of a bistable circuit in the memory cell and stability of the memory cell increased, the substantial current spike in either case causes disturbance of the voltage on the bit line contrary to the intended bit line swing. The bit line current due to this phenomenon can be substantial if several cells conduct since the peak is only reduced by a factor of about two for a four-fold increase in transient time. Thus, the implications of the parasitic transistor current are significant and difficult to reduce without severe compromise of operating speed.

Figure 4B:
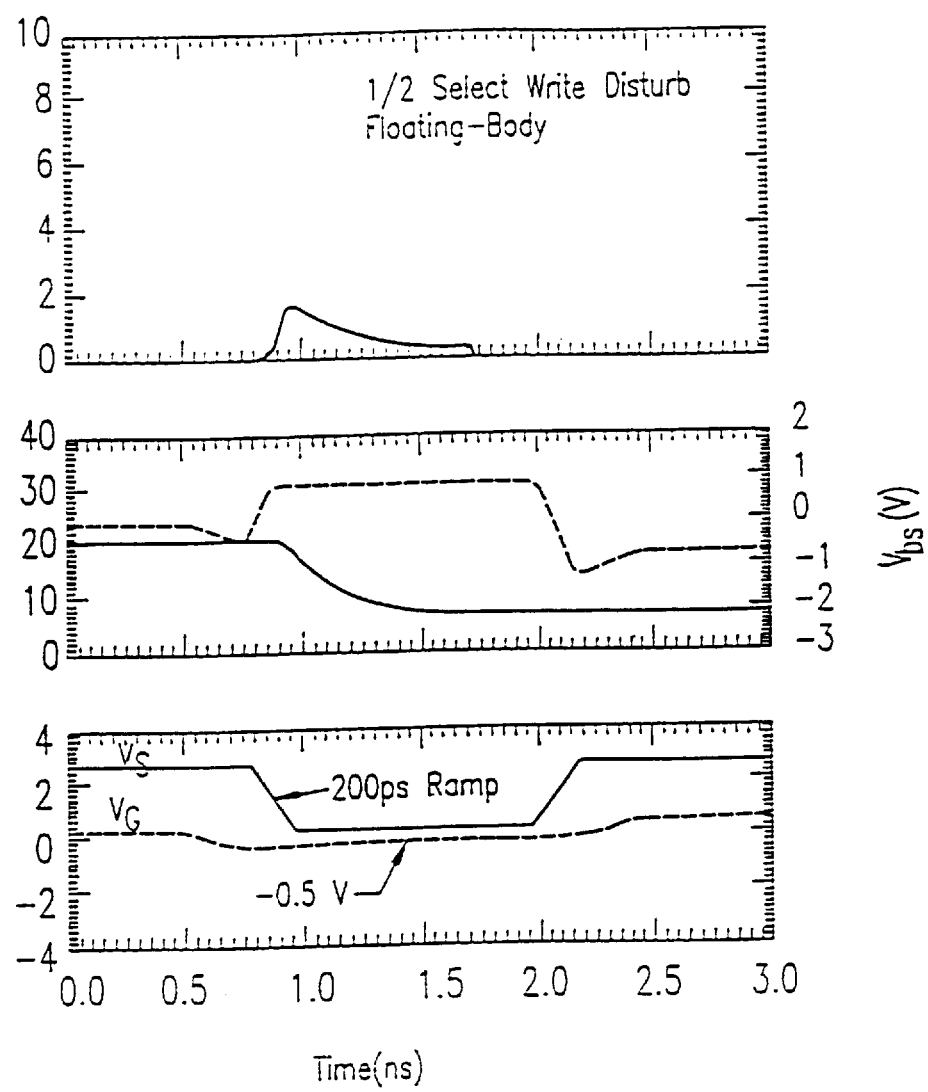
Figure 4C:
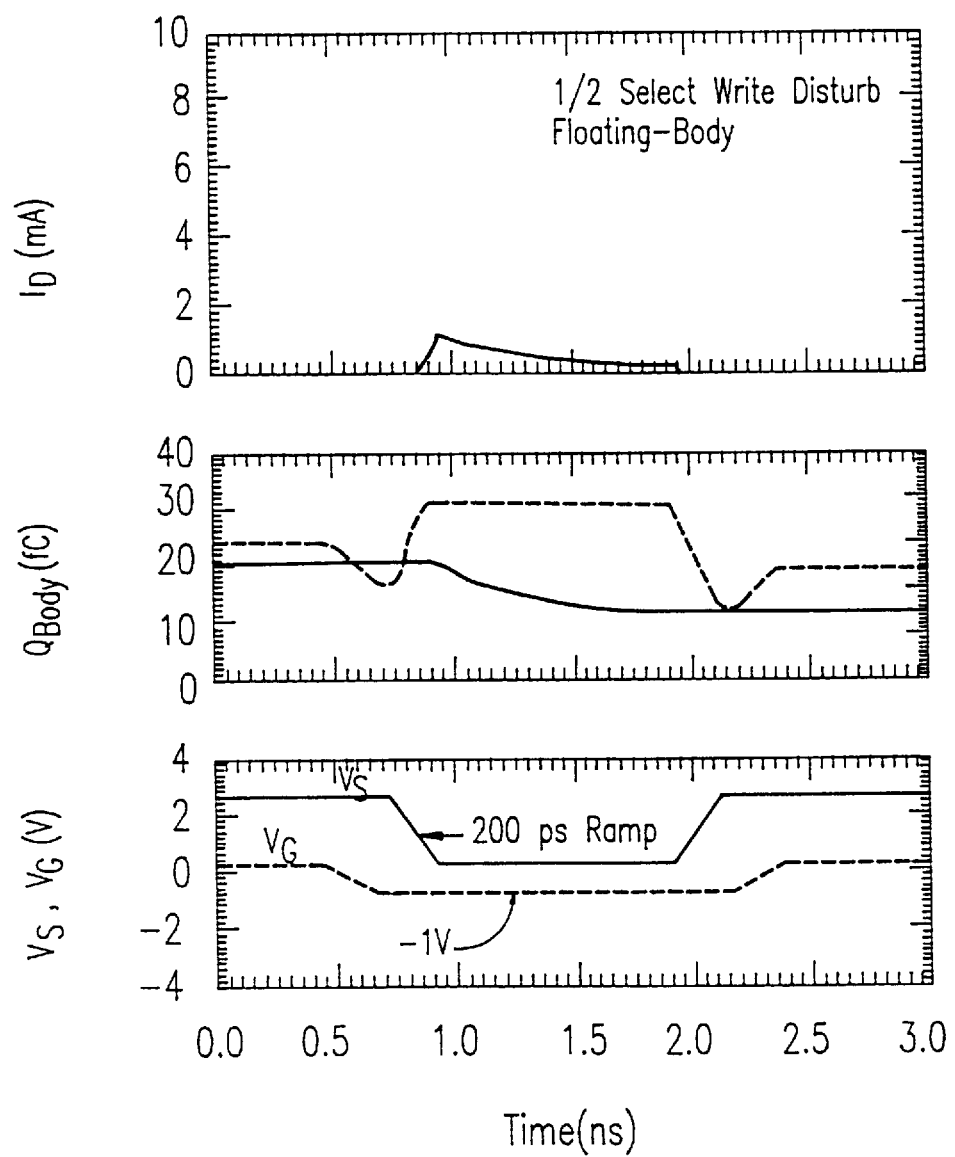
Figure 4D:
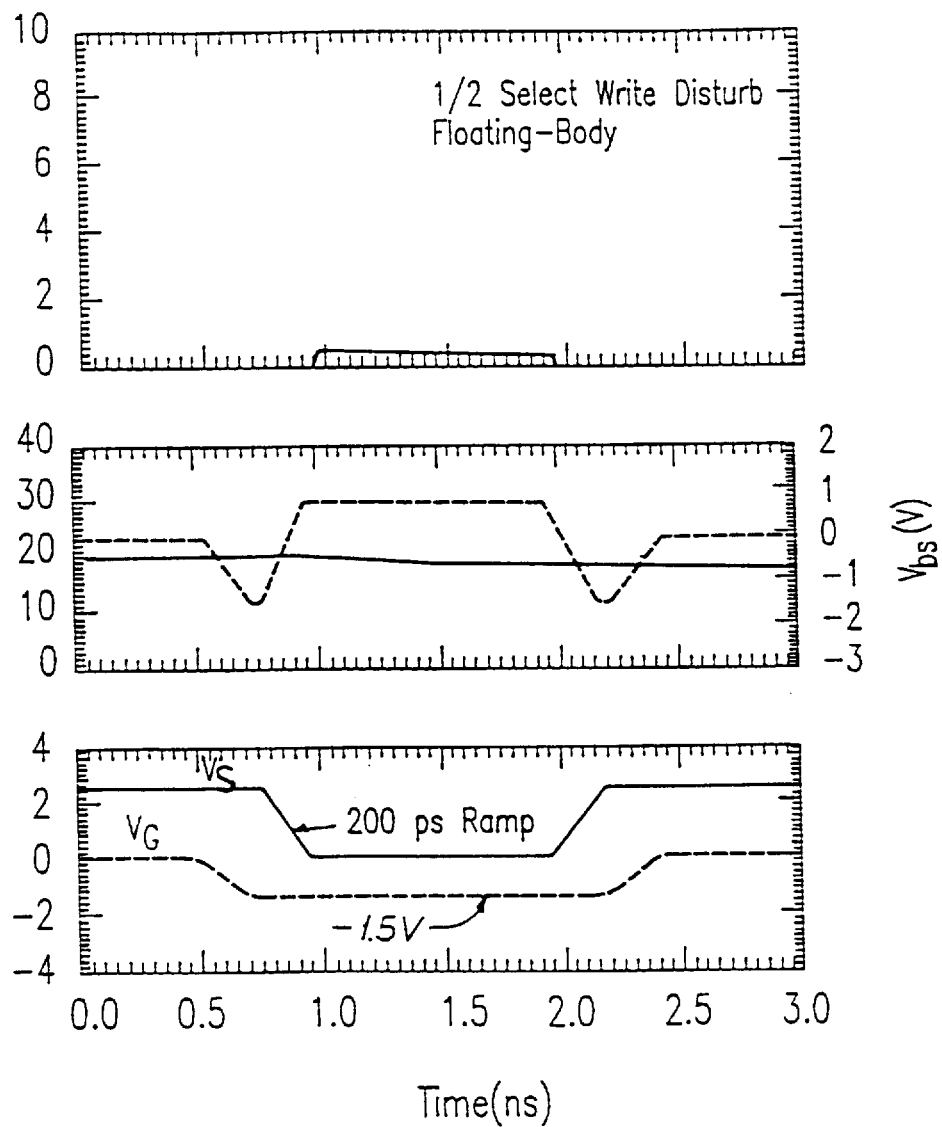

FIG. 4B graphically depicts a similar simulation for an "off" gate voltage of −0.5 volts which is provided only for a period surrounding that in which the source voltage can go low. It can be readily seen that forward bias body-source voltage is lowered prior to the source transient by the lowering of gate voltage and the current spike is reduced by about one-half. (It is also significant that when the source is again driven high and the gate voltage returns to zero that the effective forward bias does not immediately return to the same level because of the discharge of the floating body.) Similarly, in FIGS. 4C and 4D the effective forward bias is reduced even more at "off" gate voltage levels of −1.0 and −1.5 volts respectively with further reduction in the discharge and current spike. At −1.5 volts the current spike and discharge have virtually disappeared since the reduced forward bias greatly reduces dQb/dt in the parasitic bipolar transistor. It should also be noted, in comparison with FIG. 4B, that the effective forward bias returns more closely to the original value in FIG. 4C, due to reduction of the discharge, and substantially the same value in FIG. 4D, since the discharge is reduced to near-negligible levels.

Figure 5B:
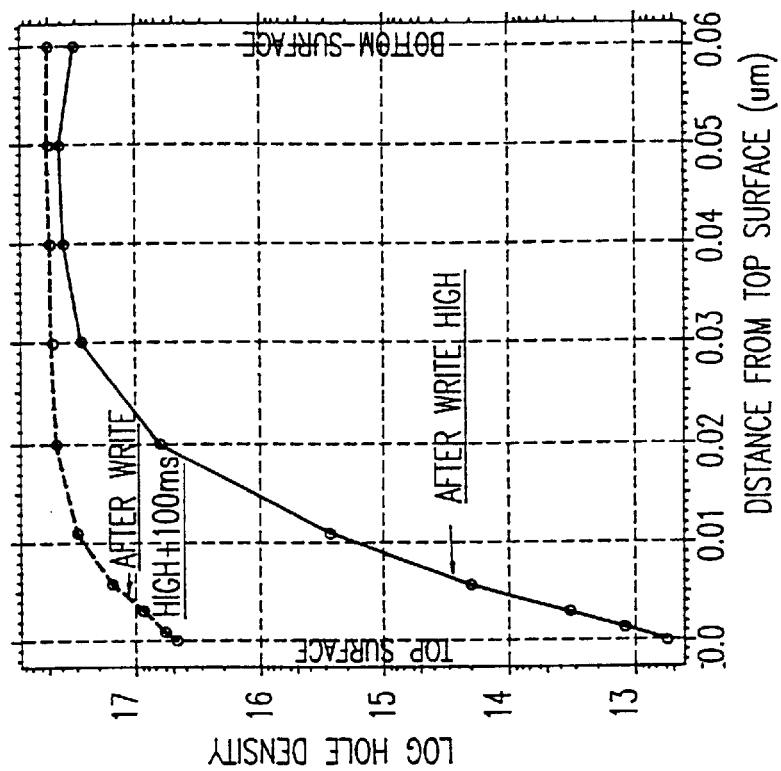
FIGS. 5A and 5B are graphs showing profiles of charge distribution within the floating body of a SOICMOS transistor before and after a 100 msec. latency period.
Figure 5A:
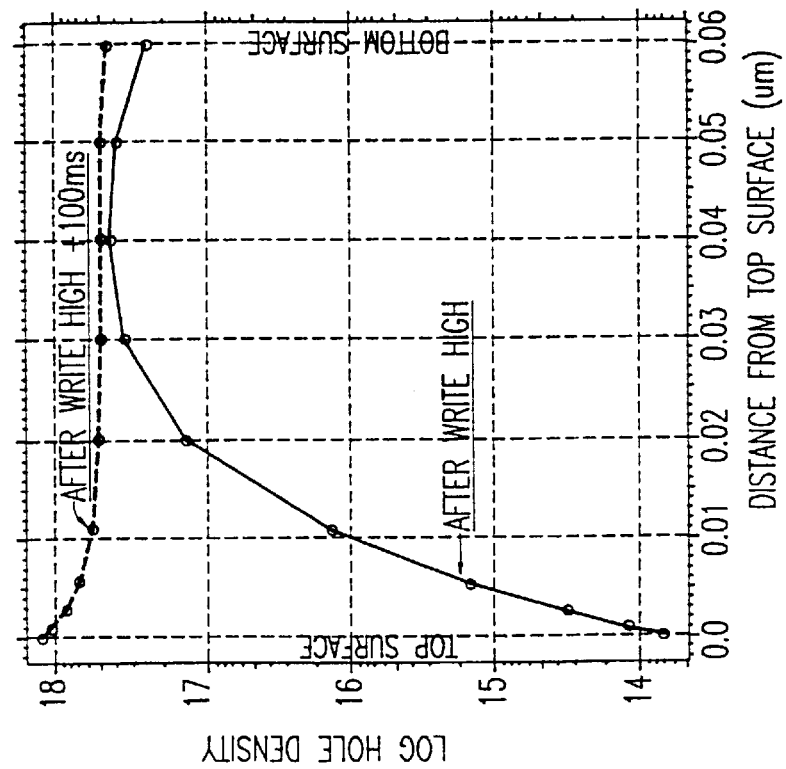

It should be appreciated that the dynamics of this process are complex and the above-described process and apparatus is not simply a matter of turning the transfer gate transistor "off" more strongly. In fact, the above technique is fully effective only if the precharge latency period can be kept below about 0.1 nsec. While such a short latency period is a realistic operating condition for SRAMs at the present time, current operational modes also may include latency periods of 100 msec. or longer in which the bit line is held high while the word line is held low. Not only will the floating body charge toward the source/drain potential during the entire latency period, the quantity of steady state majority carriers (holes for the NFET of the embodiment illustrated in FIG. 1) will be determined by the word line down level and increases with increasingly negative gate voltage in accordance with Gauss' Law since the difference in potential between the gate and body increases as the gate is driven to more negative voltages. Specifically, FIGS. 5A and 5B graphically indicate the profile of charge distribution through the thickness of the floating body before and after a 100 msec. latency period for gate voltages of –0.5 volts and 0.0 volts, respectively. Note that before the latency period in both cases, the charge near the surface is low and significant charging occurs principally at a substantial depth within the floating body but is much higher near the upper surface after the latency period. Comparing the charge after the latency period at the two gate voltages (e.g. comparing FIGS. 5A and 5B) the charge near the upper surface of the floating body is much higher for –0.5 volts. This may suggest that the reduction of the current spike with apparent reduction of gain due to increasingly negative gate voltage is only valid when the latency period is very short.

On the other hand, the magnitude of the current spike is determined both by the amount of excess charge in the floating body and by the gain of the parasitic transistor. That is, the product of the gain and the amount of excess charge in the floating body determined the quantity of charge removed from the storage node of a memory cell. For short latency, little charge is generated even when the gate voltage is driven to –1.5 volts or lower since there is little dependence on the rate or amount of charge generation during such short latency periods of less than about 1.0 nsec. However, for a significantly longer latency period of 100 msec., for example, the steady state quantity of charge will be closely approached and the amount of excess charge will be large and will increase with increasingly negative gate voltage.

Figure 6:
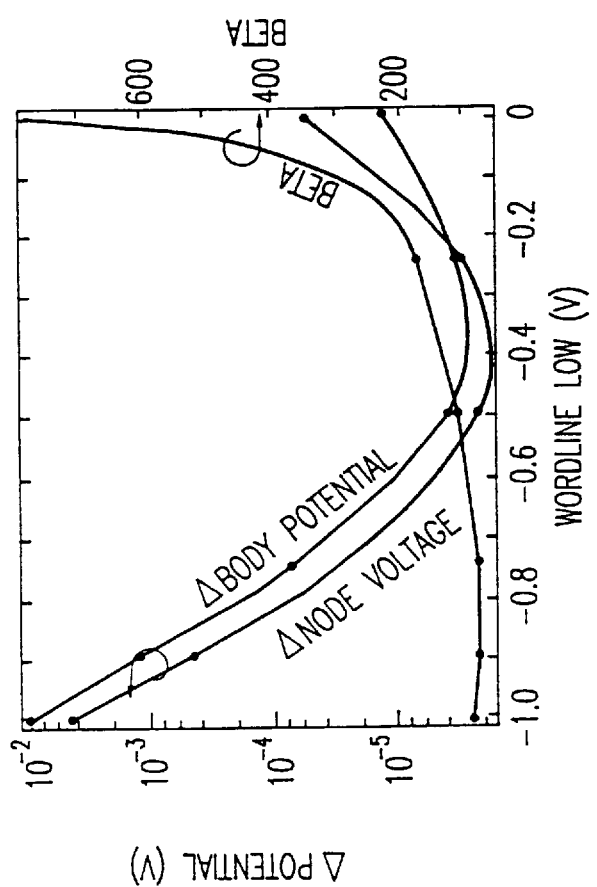
FIG. 6 is a graphical depiction of changes in floating body charge, storage node charge and parasitic transistor gain for differing gate voltages at relatively long latency.

Further modelling of the transient response of the transfer gate transistor shows that the response of the transistor is largely dependent on beta when the latency period is relatively long since the excess charge is very large. (In contrast, when the latency period is very short, the process is dominated by the small amount of charge prior to significant charging of the floating body and the reduction of forward bias due to the amount of charge which is present and the negative gate voltage capacitively coupled to the floating body. FIG. 6 graphically shows the change in body potential, node voltage and apparent transistor gain, beta, during a 7 nsec. interval in which the bitline is low. Note that both the change in body potential and the change in node voltage exhibit a minimum. At a gate potential more negative than –0.4 volts, the quantity of body charge lost during the 7 nsec. interval increases and, at gate a voltage of about –0.8 volts, the change in node voltage is about the same as at a gate voltage of 0.0 volts.

However, the gain or beta of the parasitic transistor continues to decrease with more negative gate voltages. Accordingly, a desired operating point which is effective to suppress the current spike and increase memory cell stability if the latency period is more that a few nanoseconds lies in the range of –0.3 to –0.7 volts and preferably about –0.5 volts. Further, it should be noted that an operating point in the range of about –0.4 to –0.7 volts is consistent with both long and short latency periods and yields an unconditional and substantial increase in memory cell stability even though the dominant mechanism is reversed between gain dependence and excess charge dependence as latency period changes.

Figure 7:
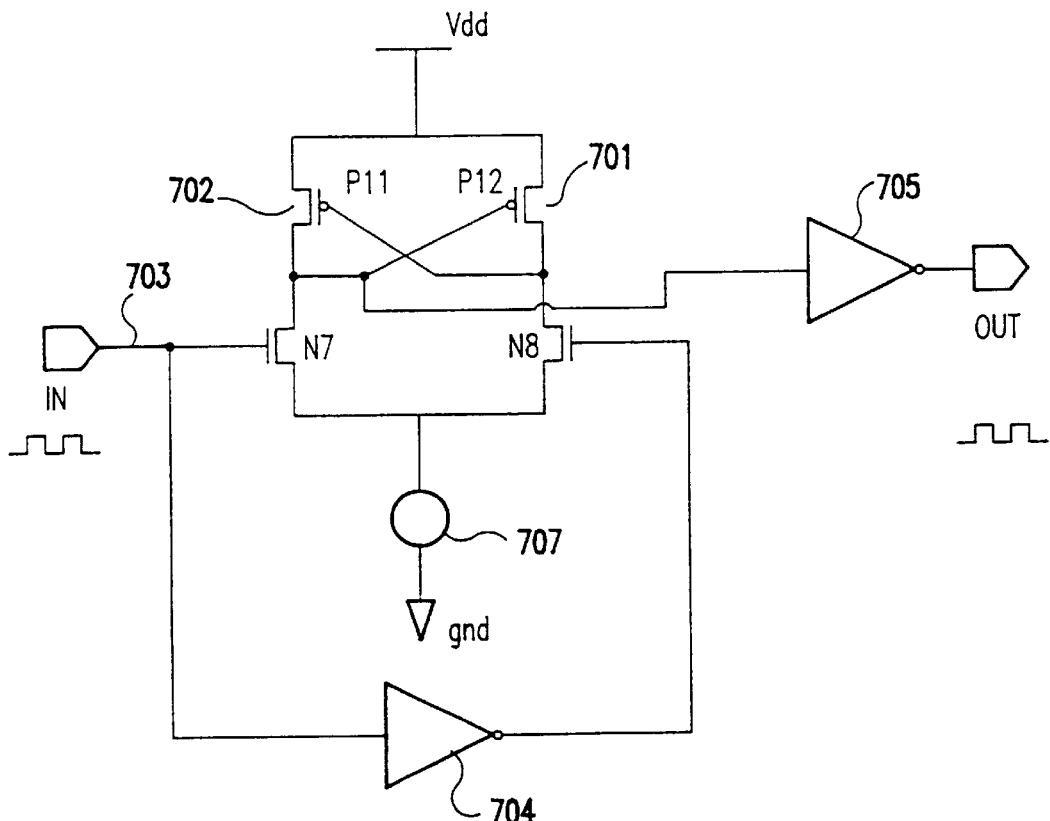
FIG. 7 is a schematic diagram of an exemplary word line driver and level shifter circuit in accordance with the invention.
Figure 8:
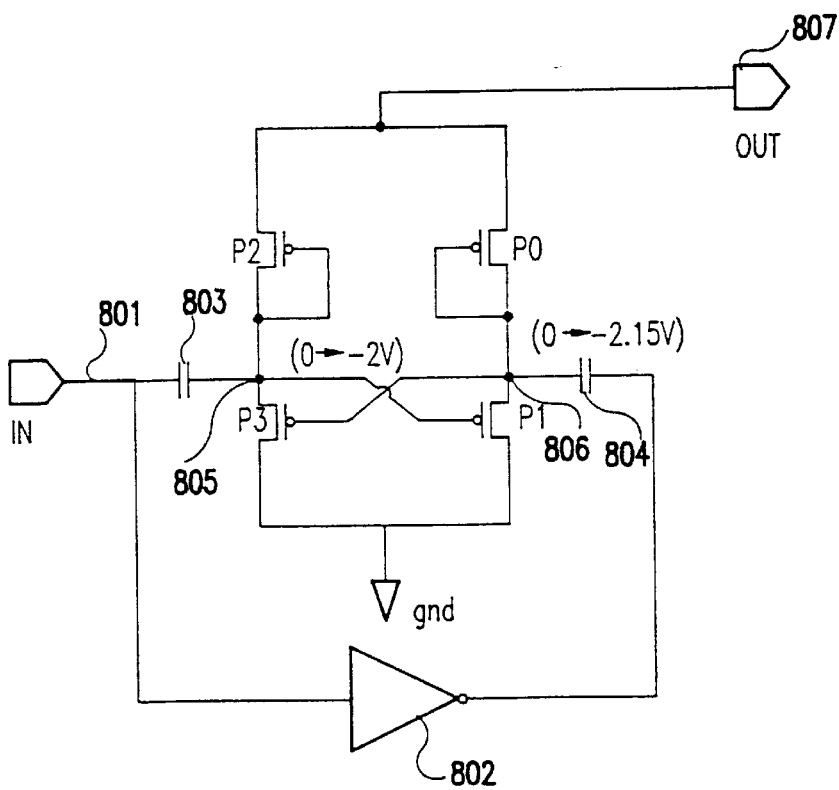
FIG. 8 is a schematic diagram of an exemplary charge pump for developing a negative word line deselect voltage in accordance with the invention.

Having demonstrated that cell stability can be improved by reduction of deselected word line voltage, a preferred circuit for providing such a voltage to the memory cell array will now be discussed with reference to FIGS. 7 and 8, showing schematic diagrams of a suitable word line driver and charge pump for practicing the invention. It should be understood that details of the word line driver and the charge pump are not critical to the practice of the invention but are preferred for integration on the same chip with a memory cell array, particularly when the memory array is formed using 6T memory cells such as are illustrated in FIG. 1.

Referring now to FIG. 7, the word line driver and level shifter (320 of FIG. 3) principally comprises a pair of cross-coupled inverters 701, 702, each including a complementary pair of transistors (N7, P11 and N8, P12) which function in a manner similar to the cross-coupled inverters forming a bistable circuit in the memory cells. However, the inputs of transistors N7 and N8 are not connected to the gates of P11 and P12 but are differentially driven in accordance with input 703 by use of inverter 704 (N9, P10). The cross-coupled inverters are connected between power supply $V_{dd}$ and a suitably negative voltage source 707 (rather than ground. Inverter 704 referenced to ground and providing a low resistance path thereto, together with the differential driving of N7 and N8 assure that the cross-coupled inverters will be driven with sufficient strength to cause a change of state of the bipolar circuit even though one input is only pulled to ground. The bistability of the cross-coupled inverters acts to suppress noise which may appear on the input signal. The output of the bistable circuit 701, 702 is input to a further inverter 705 (N25, P24), corresponding to one of inverters 330 of FIG. 3, which is also referenced to the negative voltage source 707 which then can supply either $V_{dd}$ or the negative voltage to the word line and increases the driving capability of the circuit.

Negative power supply 707 is preferably provided by a charge pump, an exemplary form of which is shown in FIG. 8. It should be noted that this circuit is similar to circuits used in high performance DRAMs for providing a negative substrate bias for enhancing substrate noise immunity and its operation should be readily understood by those skilled in the art. Basically, two cross-coupled load transistors P1 and P3 are serially connected with current source transistors P0 and P2. P1 and P3 are differentially driven from a square wave oscillator 801 through an inverter 802, referenced to ground. The sharp transients of the square wave input and its complement are coupled to P1 and P3 through capacitors 803 and 804 to cause switching thereof. Thus, a high level voltage at the input causes transistor P3 to turn on and pull node 805 toward ground and capacitor 803 will begin to charge to a voltage equal to the high level logic voltage. Similarly, when the input signal goes low, transistor P1 pulls node 806 to ground and capacitor 804 begins to charge toward the logic level voltage. At the same time, capacitor 803 is referenced to ground (e.g. the low logic level voltage and node 805 is driven negative, causing transistor P2 to conduct and apply the negative voltage to node 807. Thus, the output voltage is "pumped" below ground with each transition of oscillator 801 and by adjustment of the value of capacitors 803 and 804 relative to current requirements and the respective resistances of P1 and P3, the negative voltage (e.g. the operating point noted above) at node 807 can be adjusted by the frequency of oscillator 801.

Soft Bit Line Discharge

Referring again briefly to FIG. 4A, it will be recalled that the magnitude of the current spike can be reduced by increasing the transition time of the bit line. As would be understood by those skilled in the art, however, the cycle time and responsiveness of the memory would be compromised if the data signals input to the memory were slowed and such a mode of operation is contrary to the concept of precharged dynamic circuits which exploit asymmetrical response of CMOS circuits by precharging to the state from which they can be most rapidly switched, if necessary, to the complementary state.

Nevertheless, according to a variation of the invention usable alternatively to or in combination with reduction of word line deselect voltage, the bit line transient can be extended at other locations in the memory array. Specifically, with reference to FIG. 9, and recalling that half select write disturb effects occur upon discharge of a bit line from the precharged state, the bit line transient can be adjusted by adjusting the RC response of the bit line capacitance. For example, the channel widths of the bit line driver transistors 901, 902 (collectively 362 in FIG. 3) can be made somewhat more narrow and resistive, with consequent saving in chip space, as indicated by resistances 901' and 902'. Alternatively or together with increase of resistance of transistors 901 and 902, the resistance can be increased in transistor 903 by similarly narrowing channel width, as indicated at 903', which makes the adjustment of bit line transient time specific only to discharge of the bit line BL as indicated by discharge path 904. In this latter case the memory cell response speed and input signal operating margins are unaffected since the stability of the cell itself need not be adjusted by change of beta ratio and the slew rate of state of input data need not be adjusted to control the bit line transient. Thus the bit line transient can be extended, at will, to 400–600 psec. to reduce the magnitude of the current spike.

Figure 9:
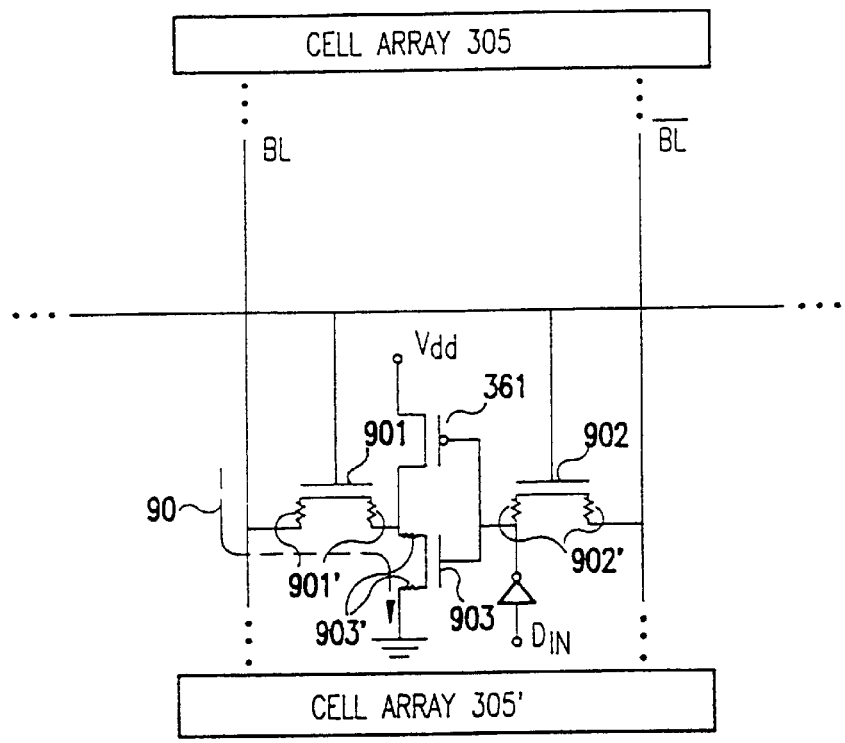
FIG. 9 illustrates a modification of the data input circuit of FIG. 3 and enlargement of the memory array to increase bit line capacitance in accordance with another aspect of the invention.
Figure 10:
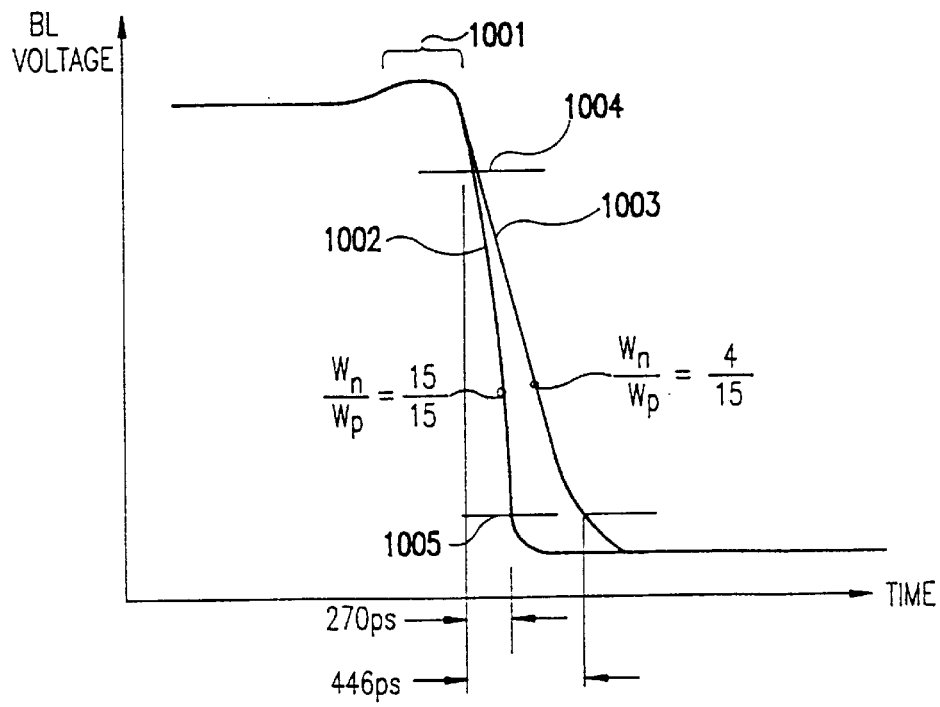
FIG. 10 shows a timing diagram illustrating the effectiveness of the aspects of the invention illustrated in FIGS. 9 and 10 and the minimal penalty in memory cycle time and writing speed.

Such an extension of the bit line transient has very little effect on the operation of the memory while being highly effective to suppress half-select write disturb effects and providing substantial advantages in reduction of chip area required for the data input circuits such as is illustrated in FIG. 9. For example, FIG. 10 shows simulated bit line voltage during discharge for two differing channel widths of, for example, transistor 903 of FIG. 9. Both curves show the precharge period 1001 immediately prior to discharge, characterized by increased bit line voltage as the bit line is connected to $V_{dd}$. For a transistor 903 having the same (e.g. 15 $\mu$m) channel width $W_n$ as the channel width $(W_p)$ of complementary p-type FET in inverter 361, the bit line voltage during discharge is shown by curve 1002. As is customary, the transition time is considered as being the interval between the point (1004) at which the voltage is 90% of difference between the high logic level voltage to the point (1005) at which the voltage reaches 10% of that difference above the low logic level voltage. For curve 1002, the transition time is 270 psec.

If the channel width of transistor 903 is reduced by about three-fourths (e.g. from 15 $\mu$m to 4 $\mu$m) the voltage transition time increases by 176 psec. to 446 psec. When this 176 psec. increase is compared with a 5 nanosecond cycle time established to provide good operating margins for the memory, the penalty is seen to be only about 3% and is comparable to the 0.1 nanosecond precharge period alluded to above. Therefore, such an adjustment of the bit line fall time has substantially negligible effect on memory operation while providing substantial improvement in memory cell stability and reduction of chip space required for the write input circuit.

In this regard, it should be appreciated that the improvement in avoidance of unintended data change for a given cell stability (e.g. beta ratio) is greater than may be evident from the reduction in peak current during the current spike. Specifically, as the current due to conduction of the parasitic bipolar transistor is spread over slightly longer periods of time, discharge of the storage node of the memory cell is reduced by the current which can be supplied to the storage node by the bistable circuit of the memory cell within the beta ratio of the transistors thereof. Recalling that the voltage of the storage node must be pulled to or below a voltage about midway between the logic voltage levels for the cell to change state, a modest reduction of peak current from the storage node through the parasitic bipolar transistor, even with only nominal amounts of current supplied through the memory cell to replace charge lost through the current spike, may correspond to a substantial reduction of incidence of half select write disturb effects at beta ratios and corresponding levels of stability currently in use. Thus, small changes in the peak current due to either lowered gate voltage and soft bit line discharge during the current spike can each substantially increase memory cell stability and the combined effects of two or more of the above-discussed arrangements for reducing the current spike (e.g. increased memory capacity, reduced channel width of write input circuit discharge transistor(s) and slight lowering of transfer gate transistor "off" level voltage) can reduce incidence of half-select write disturb effects to extremely low statistical frequency without increase of beta ratio and the attendant costs and trade-offs noted above.

Having established that adjustment of the RC time constant of the bit line and input circuit can substantially increase memory cell stability with little operational penalty while engendering advantages in device design, it should be noted that the discharge transient time can be increased in other ways alternative or in addition to alteration of channel width of one or more transistors in the bit line discharge path and possibly while engendering even more advantageous benefits in device design. For example, increase of bit line discharge time similar to that shown in FIG. 10 could be achieved by doubling the bit line length, allowing a corresponding doubling of memory capacity of a sub-array in the memory design (with attendant band width benefits) or on a single chip of increased size, as shown by inclusion of memory array 305' in FIG. 9.

In view of the foregoing, the invention provides for increase of memory cell stability and effective suppression of half-select write disturb effects by lowering of "off" transfer gate transistor control voltage and/or soft bit line discharge; the latter being accomplished with little penalty in operational speed while engendering design advantages such as substantial reduction in required chip space and/or enablement of much increased memory storage capacity of a sub-array or on a chip.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A silicon-on-insulator static logic device including
   an array of controlled elements,
   transfer gate means connected to respective ones of word lines and bit lines for controlling connection of each of said controlled elements to respective ones of said bit lines, and
   means for limiting peak parasitic bipolar transient discharge current through a respective transfer gate means from a node of respective deselected ones of said controlled elements.

2. A device as recited in claim 1, wherein said means for limiting peak parasitic bipolar transient discharge current comprises means for shifting at least one logic level voltage applied to control respective ones of said transfer gates.

3. A device as recited in claim 2, wherein said means for shifting at least one logic level voltage comprises a charge pump.

4. A device as recited in claim 2, wherein said means for limiting peak parasitic bipolar transient discharge current further comprises means for increasing resistance of a transistor in a discharge path, said discharge path including a write data input circuit including said transistor.

5. A device as recited in claim 4, wherein said means for limiting peak discharge current further comprises means for increasing capacitance of a connection of a data input and a memory cell.

6. A device as recited in claim 2, wherein said means for limiting peak discharge current further comprises means for increasing capacitance of a connection of a data input and a memory cell.

7. A device as recited in claim 1, wherein said means for limiting peak parasitic bipolar transient discharge current comprises means for increasing resistance of a transistor in a discharge path, said discharge path including a write data input circuit including said transistor.

8. A device as recited in claim 7, wherein said means for limiting peak parasitic bipolar transient discharge current comprises means for increasing capacitance of a connection of a data input and a memory cell.

9. A device as recited in claim 8, wherein said means for increasing capacitance includes a further array of controlled elements connected to bit lines which are connected to said array of controlled elements.

10. A device as recited in claim 9, wherein a said controllable element is a memory cell.

11. A device as recited in claim 1, wherein said means for limiting peak parasitic bipolar transient discharge current comprises means for increasing capacitance of a connection of a data input and a memory cell.

12. A device as recited in claim 11, wherein said means for increasing capacitance includes a further array of controlled elements connected to bit lines which are also connected to said array of controlled elements.

13. A device as recited in claim 12, wherein a said controllable element is a memory cell.

14. A device as recited in claim 1, wherein said logic device is a static random access memory and said controlled elements include bistable circuits.

15. A device as recited in claim 1, wherein said logic device is a dynamic random access memory and said controlled elements include memory capacitors.

16. A device as recited in claim 1, wherein said logic device is a pass gate logic circuit and said controlled elements include load transistors.

17. A method of suppressing transient parasitic bipolar current disturbances in a silicon-on-insulator integrated circuit when a word line is deselected and a bit line is selected including the steps of precharging bit lines connected to controlled elements included in said silicon-on-insulator integrated circuit, and limiting peak parasitic bipolar transient current from a deselected controlled element during discharge of one of said bit lines.

18. A method as recited in claim 17, wherein said step of limiting peak current includes level shifting a logic level of a word line voltage applied to a deselected transfer gate connected to said one of said bit lines.

19. A method as recited in claim 18, wherein said logic level of a control voltage is shifted by a voltage in a range of −0.3 to −0.7 volts.

20. A method as recited in claim 17, wherein a said controllable element is a memory cell.

* * * * *